United States Patent
Yen et al.

(10) Patent No.: US 10,074,587 B2
(45) Date of Patent: Sep. 11, 2018

(54) BONDING WIRE-TYPE HEAT SINK STRUCTURE FOR SEMICONDUCTOR DEVICES

(71) Applicant: REALTEK SEMICONDUCTOR CORPORATION, Hsinchu (TW)

(72) Inventors: Hsiao-Tsung Yen, Hsinchu (TW); Chih-Yu Tsai, Hsinchu (TW); Cheng-Wei Luo, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/459,915

(22) Filed: Mar. 15, 2017

(65) Prior Publication Data
US 2017/0271234 A1    Sep. 21, 2017

(30) Foreign Application Priority Data
Mar. 17, 2016    (TW) ............... 105108252 A (51) Int. Cl.
*H01L 23/367* (2006.01)
*H01L 23/00* (2006.01)

(52) U.S. Cl.
CPC .......... *H01L 23/3677* (2013.01); *H01L 24/04* (2013.01); *H01L 24/48* (2013.01);
(Continued)

(58) Field of Classification Search
CPC ..... H01L 23/3677; H01L 23/48; H01L 24/04; H01L 24/48; H01L 23/49568;
(Continued)

(56) References Cited

U.S. PATENT DOCUMENTS 6,720,662 B1 * 4/2004 Den ................... H01L 23/4334
                                                    257/659
7,989,949 B2    8/2011 Gupta et al.
(Continued)

FOREIGN PATENT DOCUMENTS

TW    200926370    6/2009
TW    M511673      11/2015

OTHER PUBLICATIONS

Office action from the Taiwan patent office for counterpart application No. 105108252 dated Jun. 19, 2017.
(Continued)

*Primary Examiner* — Mohsen Ahmadi
(74) *Attorney, Agent, or Firm* — WPAT, PC (57) ABSTRACT

The present invention discloses a bonding-wire-type heat sink structure for semiconductor devices. An embodiment of the said bonding-wire-type heat sink structure comprises: a semiconductor substrate; a heat source formed on or included in the semiconductor substrate, said heat source including at least one hot spot; at least one heat conduction layer; at least one heat conductor connecting the at least one hot spot with the at least one heat conduction layer; at least one heat dissipation component in an electrically floating state; and at least one bonding wire connecting the at least one heat conduction layer with the at least one heat dissipation component, so as to transmit the heat of the heat source to the heat dissipation component.

10 Claims, 7 Drawing Sheets

(52) U.S. Cl.
CPC ............. *H01L 2224/04042* (2013.01); *H01L 2224/4813* (2013.01); *H01L 2224/48175* (2013.01); *H01L 2224/48245* (2013.01)

(58) Field of Classification Search
CPC ....... H01L 2023/4043; H01L 2023/405; H01L 2023/4056; H01L 2023/4062; H01L 2023/4068; H01L 2023/4081; H01L 2224/04042
See application file for complete search history.

(56) References Cited

U.S. PATENT DOCUMENTS

| | | | | |
|---|---|---|---|---|
| 2002/0098622 | A1* | 7/2002 | Tsuda | H01L 23/36 438/122 |
| 2002/0105079 | A1 | 8/2002 | Yamaguchi | |
| 2008/0123291 | A1 | 5/2008 | Wang et al. | |
| 2009/0026605 | A1* | 1/2009 | Gupta | H01L 23/3677 257/712 |
| 2011/0089517 | A1 | 4/2011 | Venezia et al. | |
| 2012/0014069 | A1* | 1/2012 | Zeng | H01L 23/4334 361/718 |

OTHER PUBLICATIONS

English abstract translation of the office action from the Taiwan patent office for counterpart application No. 105108252 dated Jun. 19, 2017.

Office action from the Taiwan patent office for counterpart application No. 10620639780 dated Jun. 19, 2017.

English abstract translation of the office action from the Taiwan patent office for counterpart application No. 10620639780 dated Jun. 19, 2017.

English abstract translation of Taiwan patent No. M511673.

\* cited by examiner

BONDING WIRE-TYPE HEAT SINK STRUCTURE FOR SEMICONDUCTOR DEVICES

BACKGROUND OF THE INVENTION

1. Field of the Invention

The present invention relates to a heat sink structure, especially to a heat sink structure for semiconductor devices.

2. Description of Related Art

A semiconductor device generates heat during its operation, and a heat sink design is therefore required to prevent the device operation from being affected by the heat. Most of conventional heat sink designs for semiconductor devices are realized at package level or printed circuit board (PCB) level. The heat sink design at package level usually utilizes an external heat sink device to dissipate heat of a packaged semiconductor device, and the heat sink design of printed circuit board level usually utilizes an external heat sink device as well to comprehensively dissipate heat of a PCB where a packaged semiconductor device is set. The efficacy of such heat sink designs get worse as the development of semiconductor processes progress on. Regarding an advanced semiconductor process (e.g., a complementary metal-oxide-semiconductor (CMOS) process of 55 nanometer or less), such heat sink designs is obviously not robust enough.

In view of the problems of the conventional heat sink designs, this industrial field long for a heat sink technique capable of dissipating heat of the heat source (e.g., transistors) of a semiconductor device effectively and thus satisfying heat sinking requirements of advanced and future semiconductor processes.

For those who are interested in the prior art may refer to the following literature: the published US patent application (Pub. No.: US 2011/0089517 A1).

SUMMARY OF THE INVENTION

An object of the present invention is to provide a bonding-wire-type heat sink structure for semiconductor devices, so as to resolve the problem of the prior arts.

The present invention discloses a bonding-wire-type heat sink structure for semiconductor devices. An embodiment of the bonding-wire-type heat sink structure includes: a semiconductor substrate; a heat source formed on or included in the semiconductor substrate, said heat source having at least one hot spot; at least one heat conduction layer; at least one heat conductor connecting the at least one hot spot with the at least one heat conduction layer; at least one heat dissipation component in an electrically floating state; and at least one bonding wire connecting the at least one heat conduction layer with the at least one heat dissipation component, so as to transmit the heat of the heat source to the heat dissipation component. In an exemplary implementation of this embodiment, the heat source has a transistor, and the at least one hot spot includes at least one of a source, a drain, and a gate of the transistor. In another exemplary implementation of this embodiment, the heat source has a pickup of the semiconductor substrate. In a further exemplary implementation of this embodiment, the at least one heat conduction layer includes P bonding pad(s), the at least one heat dissipation component includes S heat dissipation component(s), the at least one bonding wire includes N bonding wire(s), the N bonding wire(s) connect(s) the P bonding pad(s) with the S heat dissipation component(s), and two of P, N, S are positive integers and the other one is an integer greater than one.

Another embodiment of the said bonding-wire-type heat sink structure includes: a semiconductor substrate; a heat source formed on or included in the semiconductor substrate, said heat source having at least one hot spot; at least one heat conduction layer; at least one heat conductor connecting the at least one hot spot with the at least one heat conduction layer; at least one heat dissipation component; and a plurality of bonding wires connecting the at least one heat conduction layer with the at least one heat dissipation component, so as to transmit the heat of the heat source to the heat dissipation component. In an exemplary implementation of this embodiment, the number of the bonding wires is equal to or greater than ten.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this invention field. If any term is defined in this specification, such term should be explained accordingly. Besides, the connection between objects in the following embodiments can be direct or indirect provided that these embodiments are still practicable under such connection. Said "indirect" means that an intermediate object or a physical space is existed between the objects. Furthermore, the shape, size, and scale of any element in the figures are just exemplary for understanding, not for limiting the scope of this invention.

The present invention discloses a bonding-wire-type heat sink structure for semiconductor devices. The heat sink structure is realized in integrated circuit level and capable of dissipating heat of an integrated circuit quickly, so that the heat sink design challenges in an advanced semiconductor process (e.g., a process of 55 nanometer or less) can be overcome effectively. The heat sink structure of the present invention is included in a packaged finished product (e.g., a packaged integrated circuit) or a non-packaged semi-finished product (e.g., a non-packaged integrated circuit), and may include a well-known element. The description or illustration of the said well-known element will be omitted providing the written description and enablement requirements are still fulfilled.

Figure 1:
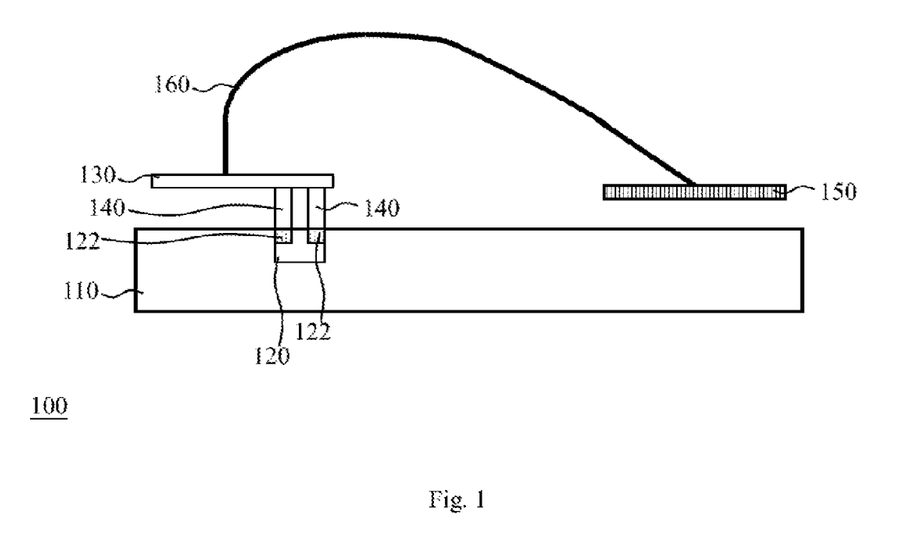
FIG. 1 illustrates an embodiment of the bonding-wire-type heat sink structure of the present invention.

Please refer to FIG. 1 which illustrates an embodiment of the bonding-wire-type heat sink structure of the present invention. As shown in FIG. 1, the bonding-wire-type heat sink structure 100 includes: a semiconductor substrate 110; a heat source 120; at least one heat conduction layer 130; at least one heat conductor 140; at least one heat dissipation component 150; and at least one bonding wire 160. The semiconductor substrate 110 may include a silicon substrate or other kinds of known or self-developed semiconductor substrates. The semiconductor substrate 110 in this embodiment includes integrated circuits formed therein or thereon; however, this is not a limitation to the implementation of this embodiment. The heat source 120 is on or included in the semiconductor substrate 110; in other words, the heat source 120 could be a part or not a part of the semiconductor substrate 110. In addition, the heat source 120 includes at least one hot spot 122. In an exemplary implementation of this embodiment, the heat source 120 includes a transistor such as, but not limited to, a transistor fabricated by 55 nanometer CMOS process or less, and the at least one hot spot 122 includes at least one of a source, a drain, and a gate of the transistor. In another exemplary implementation of this embodiment, the at least one hot spot 122 includes at least one pickup of the semiconductor substrate 110.

Figure 2:
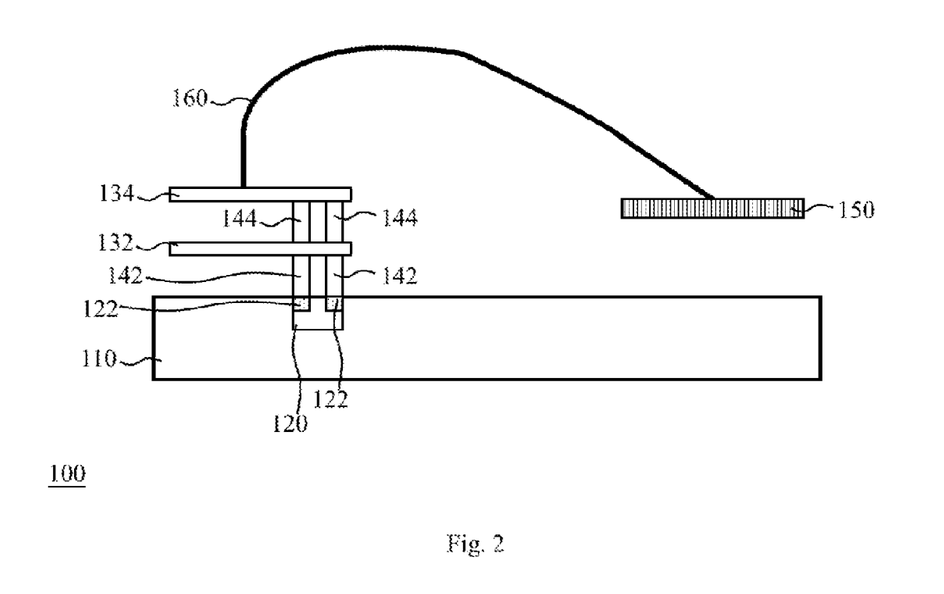
FIG. 2 shows an exemplary implementation of the embodiment of FIG. 1.

Please refer to FIG. 1 again. The at least one heat conductor 140 connects the at least one hot spot 122 and the at least one heat conduction layer 130, so as to transmit heat of the at least one hot spot 122 to the at least one heat conduction layer 130. In an instance of the at least one heat conduction layer 130, it is composed of at least one metal layer; in another instance of the at least one heat conduction layer 130, it includes a nonmetal layer such as a graphite layer of good thermal-conductivity; in a further instance of the at least one heat conduction layer 130, it includes a metal layer and a nonmetal layer concurrently. In an exemplary implementation of the present invention as shown in FIG. 2, the at least one heat conduction layer 130 includes a first heat conduction layer 132 (i.e., a first metal layer in this exemplary implementation) and a top heat conduction layer 134 (i.e., a top metal layer in this exemplary implementation), and one or more heat conduction layers (not shown in the figure) may be included between the first heat conduction layer 132 and the top heat conduction layer 134 in accordance with the design requirement or the type of application. In the same exemplary implementation, the at least one heat conductor 140 includes at least one first heat conductor 142 and at least one top heat conductor 144, and one or more heat conductors (not shown in the figure) may be included between the first heat conductor 142 and the top heat conductor 144 in accordance with the design requirement or the type of application. An instance of the at least one first heat conductor 142 could be at least one contact of a semiconductor process while at least one contact includes a through hole and heat conduction material (e.g., metal material such as gold, silver, copper, copper alloy, aluminum and aluminum alloy, or nonmetal material such as graphite) therein. As shown in FIG. 2, the at least one first heat conductor 142 connects the first heat conduction layer 132 with the at least one hot spot 122. Similarly, an instance of the at least one top heat conductor 144 could be at least one via of a semiconductor process while the at least one via includes a through hole and heat conduction material (e.g., metal material such as gold, silver, copper, copper alloy, aluminum and aluminum alloy, or nonmetal material such as graphite) therein. As shown in FIG. 2, the at least one top heat conductor 144 connects the top heat conduction layer 134 with an underneath heat conduction layer, the underneath heat conduction layer is included in the at least one heat conduction layer 130, and the underneath heat conduction layer is the first heat conduction layer 132 or a $K^{th}$ heat conduction layer when at least one additional heat conduction layer is formed between the first heat conduction layer 132 and the top heat conduction layer 134, in which the ordinal number K is an integer greater than one in relation to the ordinal number of the first heat conduction layer 132.

Please refer to FIG. 1 again. The at least one heat dissipation component 150 could be in an electrically floating state or of a prescribed voltage. In an exemplary implementation of this embodiment, provided that the heat source 120 includes a transistor, the at least one heat dissipation component 150 is in an electrically floating state so as to prevent the operation of the transistor from being affected; however, as long as the transistor operation is substantially unaffected, the at least one heat dissipation component 150 could be of a prescribed voltage (e.g., a fixed voltage) rather than in the electrically floating state. In another exemplary implementation of this embodiment, provided that the at least one hot spot 122 is at least one pickup of the semiconductor substrate 110, the at least one heat dissipation component 150 could be in an electrically floating state or of a prescribed voltage such as a fixed voltage (e.g., a DC high voltage, a DC low voltage, or a ground voltage). In addition, an instance of the at least one heat dissipation component 150 is composed of at least one of the following components: an additional metal pad exclusively/concurrently for the achievement of the present invention; a dummy metal layout realized through an existing integrated circuit design; a lead frame; and an exposed pad (ePAD). Another instance of the at least one heat dissipation component 150 is a semiconductor-process-compatible heat dissipation component such as graphite and nanotube. It should be noted that the above-mentioned metal layout, lead frame and ePAD are well-known in this technology field, and thus further details are omitted for brevity.

Figure 3:
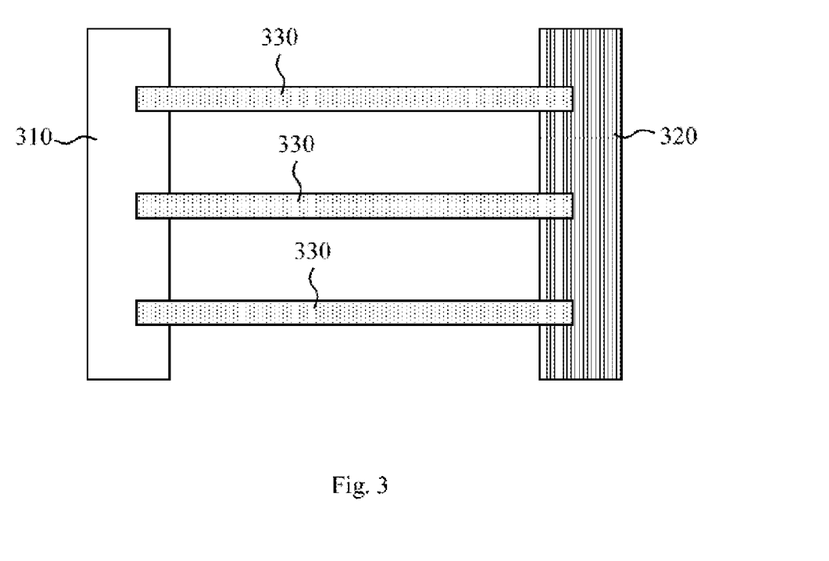
FIG. 3 shows a partial top view of an exemplary implementation of the embodiment of FIG. 1.
Figure 4:
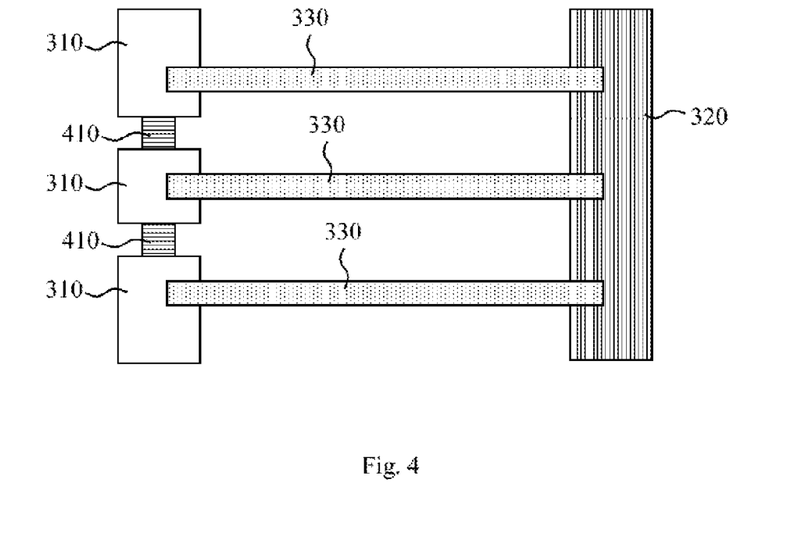
FIG. 4 shows a partial top view of an exemplary implementation of the embodiment of FIG. 1.
Figure 5:
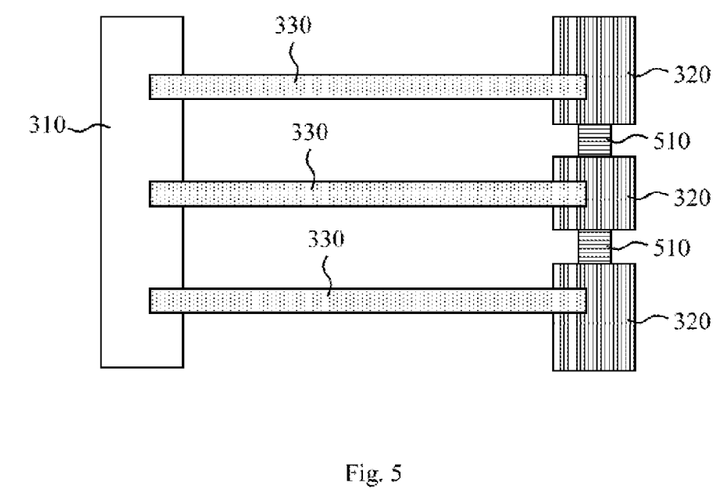
FIG. 5 shows a partial top view of an exemplary implementation of the embodiment of FIG. 1.

Please refer to FIG. 1 again. The at least one bonding wire 160 connects the at least one heat conduction layer 130 and the at least one heat dissipation component 150, so that the heat of the heat source 120 is transmitted to the at least one heat dissipation component 150 through the at least one heat conduction layer 130 and the at least one bonding wire 160. The material of the at least one bonding wire 160 is metal or nonmetal of good thermal-conductivity and reliability. In an exemplary implementation of this embodiment as shown in FIG. 3, the at least one heat conduction layer 130 includes P bonding pad(s) 310 (P=1 in FIG. 3 for illustration and understanding), the at least one heat dissipation component 150 includes S heat dissipation component(s) 320 (S=1 in FIG. 3 for illustration and understanding), the at least one bonding wire 160 includes N bonding wire(s) 330 (N=3 in FIG. 3 for illustration and understanding), and the N bonding wire(s) 330 connect(s) the P bonding pad(s) 310 with the S heat dissipation component(s) 320, in which two of P, N, S are positive integers and the other one is an integer greater than one. If P is an integer greater than one (P=3 as shown in FIG. 4), the P bonding pads 310 could be connected together through at least one bonding pad connection route 410 to improve heat dissipation efficiency; however, this connection route 410 is an option instead of a requirement. It should be noted that some or all of the said bonding pad connection route 410 may be included in the aforementioned top heat conduction layer 134 or the aforementioned underneath heat conduction layer, so as to realize thermal conduction between the P bonding pads 310. Similarly, if S is an integer greater than one (S=3 as shown in FIG. 5), the S heat dissipation components 320 may be connected together through at least one heat dissipation component connection route 510, so as to realize thermal conduction between the S heat dissipation components 320; however, this connection route 510 is an option instead of a requirement. It should be noted that the heat dissipation component connection route 510 might cause influence of electromagnetic interference (EMI); however, this is not the topic of the present invention.

Figure 6:
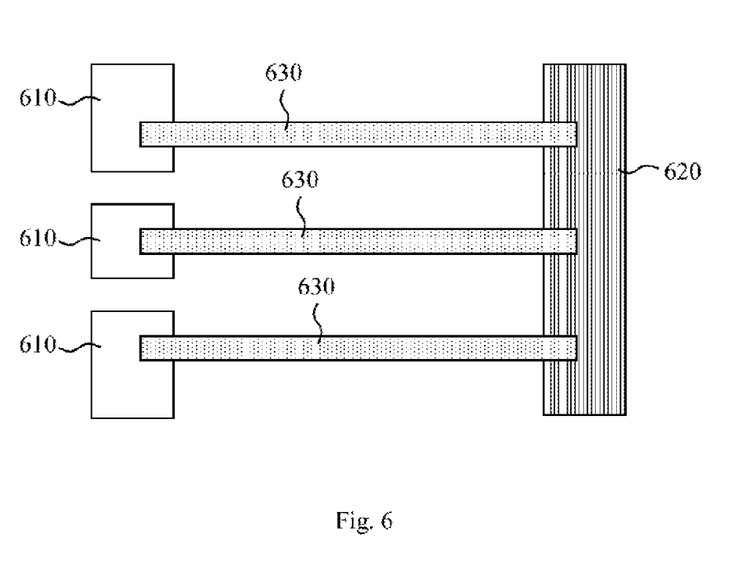
FIG. 6 shows a partial top view of an exemplary implementation of the embodiment of FIG. 1.
Figure 7:
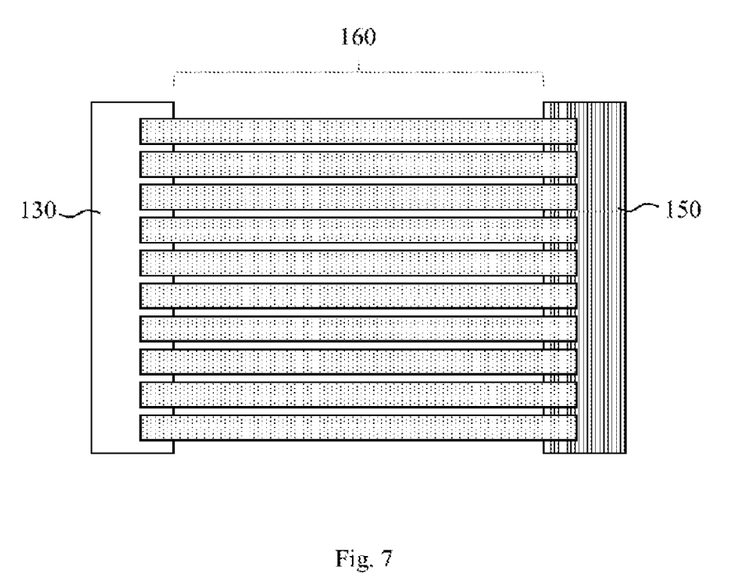
FIG. 7 shows a partial top view of an exemplary implementation of the embodiment of FIG. 1.

In view of the above description, in another exemplary implementation of the embodiment of FIG. 1 as shown in FIG. 6, the at least one heat conduction layer 130 includes P bonding pad(s) 610 (P=3 in FIG. 6 for illustration and understanding), the at least one heat dissipation component 150 includes S heat dissipation component(s) 620 (S=1 in FIG. 6 for illustration and understanding), the at least one bonding wire 160 includes N bonding wire(s) 630 (N=3 in FIG. 3 for illustration and understanding), and the N bonding wire(s) 630 connects the P bonding pad(s) 610 with the S heat dissipation component(s) 620, in which one of P, N, S is a positive integer and the others are integers greater than one. In a further exemplary implementation, the at least one bonding wire 160 includes N bonding wires, in which N is equal to or greater than two and preferred to be a number (e.g., ten) between five and fifteen as shown in FIG. 7; however, as long as the exemplary implementation is practicable, there is no limit to N. It should be noted the size and shape of the at least one bonding wire 160 is not restricted providing an implementation with such bonding wire 160 is practicable. For instance, the width(s) of the at least one bonding wire(s) 160 is wider for robust heat dissipation. It should also be noted that the at least one bonding wire 160 is formed during a semiconductor packaging processing stage; however, the at least one bonding wire 160 could be formed during an integrated circuit processing stage as long as such process is available. As a result, the present invention not only achieves the purpose of heat dissipation but also provides the effect of shielding for signal wires in an integrated circuit; more specifically, a plurality of bonding wires can be an shielding against radiation, so that the radiation from a source of radiation below the plurality of bonding wires is mitigated.

Please refer to FIG. 1 again. In order to enhance the effect of heat dissipation, the heat source 120 and the at least one heat dissipation component 150 are located on opposite sides of the semiconductor substrate 110 respectively. In another embodiment of the present invention, one or both of the heat source 120 and the at least one heat dissipation component 150 is/are located at the center of the semiconductor substrate 110, or the distance between the heat source 120 and the at least one heat dissipation component 150 is greater than a minimum distance such as 150 micrometer; as a result, the distance between the heat source 120 and the at least one heat dissipation component 150 should be enough for the formation of the at least one bonding wire 160. In an exemplary implementation of FIG. 1, in order to protect the heat sink structure 100 from external force or erosion, a packaging material (e.g., glue material) could be used to cover the heat sink structure 100 while the at least one heat dissipation 150 of the heat sink structure 100 may be exposed to outside or to a heat dissipation area without being covered by the packaging material. It should be noted that those of ordinary skill in the art can appreciate an additional component or material may be located between components in the figures of this specification, so as to enhance the function of protection, support, insulation, connection, etc.; for instance, a structure may be formed between the at least one heat dissipation component 150 and the semiconductor substrate 110 for supporting the at least one heat dissipation component 150.

Please note that as long as an implementation derived from one or more of the embodiments in this specification is practicable, a person of ordinary skill in the art can selectively make use of some or all of the features in one embodiment or selectively make use of a combination of some or all features in several embodiments to have the implementation realized without undue diligence.

In summary, the bonding-wire type heat sink structure adapted for semiconductor devices can dissipate heat of an integrated circuit quickly, and thereby overcoming the heat sink design challenges in advanced processes (e.g., processes of 55 nanometer or less). Furthermore, the heat sink structure of the present invention can be realized through a mature semiconductor process which may or may not include a semiconductor packaging process; accordingly, the heat sink structure of the present invention achieves better heat sink efficiency than conventional heat sink designs at package or PCB level and thus reduces costs an overall heat sink design for semiconductor devices (none or smaller heat sink designs at package or PCB level may be implemented).

While the subject matter is described in conjunction with the aforementioned alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

What is claimed is:

1. A bonding-wire-type heat sink structure for semiconductor devices, said bonding-wire-type heat sink structure comprising:
   a semiconductor substrate;
   a heat source formed on or included in the semiconductor substrate, said heat source having at least one hot spot;
   at least one heat conduction layer;
   at least one heat conductor connecting the at least one hot spot with the at least one heat conduction layer;
   at least one heat dissipation component in an electrically floating state; and
   at least one bonding wire connecting the at least one heat conduction layer with the at least one heat dissipation component, so as to transmit heat of the heat source to the heat dissipation component,
   wherein the at least one heat conduction layer includes at least a first heat conduction layer and a second heat conduction layer, the at least one heat conductor includes at least one first heat conductor and at least one second heat conductor, the at least one first heat conductor connects the first heat conduction layer with the at least one hot spot, and the at least one second heat conductor connects the second heat conduction layer with the first heat conduction layer that is below the second heat conduction layer.

2. The bonding-wire-type heat sink structure of claim 1, wherein the heat source includes a transistor, and the at least one hot spot includes at least one of a source, a drain, and a gate of the transistor.

3. The bonding-wire-type heat sink structure of claim 2, wherein a size of the transistor conforms to a semiconductor device fabrication node of 55 nanometer or less.

4. The bonding-wire-type heat sink structure of claim 1, wherein the at least one hot spot includes at least one pickup of the semiconductor substrate.

5. The bonding-wire-type heat sink structure of claim 1, wherein the second heat conduction layer is a topmost layer connecting to the at least one bonding wire.

6. The bonding-wire-type heat sink structure of claim 1, wherein the at least one heat conduction layer includes P bonding pad(s), the at least one heat dissipation component includes S heat dissipation component(s), the at least one bonding wire includes N bonding wire(s), the N bonding wire(s) connect(s) the P bonding pad(s) with the S heat dissipation component(s), and two of the P, the N and the S are positive integers and the other one of the P, the N and the S is an integer greater than one.

7. The bonding-wire-type heat sink structure of claim 6, wherein the P is an integer greater than one, and the P bonding pads are connected together through at least one bonding pad connection route.

8. The bonding-wire-type heat sink structure of claim 1, wherein the at least one heat conductor is a lead frame.

9. The bonding-wire-type heat sink structure of claim 1, wherein the at least one heat dissipation component is an exposed pad (ePAD) formed under the semiconductor substrate.

10. A bonding-wire-type heat sink structure for semiconductor devices, said bonding-wire-type heat sink structure comprising:

a semiconductor substrate;
a heat source formed on or included in the semiconductor substrate, said heat source having at least one hot spot;
at least one heat conduction layer;
at least one heat conductor connecting the at least one hot spot with the at least one heat conduction layer;
at least one heat dissipation component; and
a plurality of bonding wires connecting the at least one heat conduction layer with the at least one heat dissipation component, so as to transmit heat of the heat source to the heat dissipation component,
wherein a number of the bonding wires is equal to or greater than ten, the at least one heat conduction layer includes at least a first heat conduction layer and a second heat conduction layer, the at least one heat conductor includes at least one first heat conductor and at least one second heat conductor, the at least one first heat conductor connects the first heat conduction layer with the at least one hot spot, and the at least one second heat conductor connects the second heat conduction layer with the first heat conduction layer that is below the second heat conduction layer.

* * * * *